United States Patent [19]

Nodera

[11] Patent Number: 4,761,603
[45] Date of Patent: * Aug. 2, 1988

[54] HIGH FREQUENCY OSCILLATION PROXIMITY SWITCH

[75] Inventor: Hisatoshi Nodera, Kusatsu, Japan

[73] Assignee: Omron Tateisi Electronics Co., Kyoto, Japan

[*] Notice: The portion of the term of this patent subsequent to Sep. 23, 2003 has been disclaimed.

[21] Appl. No.: 833,253

[22] Filed: Feb. 27, 1986

[30] Foreign Application Priority Data

Feb. 28, 1985 [JP] Japan ............................... 60-39784

[51] Int. Cl.$^4$ ............................................. G05F 3/16
[52] U.S. Cl. ...................................... 323/315; 331/65
[58] Field of Search ........................... 331/65; 323/315

[56] References Cited

U.S. PATENT DOCUMENTS 3,883,796  5/1975  Holt et al. .............................. 331/65
4,613,830  9/1986  Kamiya et al. ........................ 331/65

Primary Examiner—Patrick R. Salce
Assistant Examiner—Jeffrey L. Sterrett
Attorney, Agent, or Firm—Wegner & Bretschneider

[57] ABSTRACT

A proximity switch which includes a current feedback type oscillator so that an object in proximity may be detected by the decline in the oscillation output. In order to increase the recovery speed of the oscillation which has dropped as a result of detecting an approaching object, in addition to a first comparison circuit for detecting the object from the oscillation output level, a second comparison circuit is provided for varying the feedback current to the oscillation circuit for maintaining the oscillation level at a certain low level even when the object has come sufficiently close to the proximity switch to otherwise completely terminate the oscillation. By virtue of the increased response speed of the proximity switch, it may be used in an environment where a strong AC magnetic field is present.

8 Claims, 7 Drawing Sheets

4,761,603

HIGH FREQUENCY OSCILLATION PROXIMITY SWITCH

BRIEF SUMMARY OF THE INVENTION

This invention relates to a proximity switch of high frequency oscillation type with an improved response speed in detecting an object.

The conventional proximity switch of high frequency oscillation type is such that it includes a detection coil in its detection head and an oscillation circuit is formed therein using the detection coil as an oscillation coil, so as to detect an object from the decline in the oscillation output due to the decline in the inductance of the oscillation coil.

One form of an oscillation circuit of current feedback type which may be used in the conventional proximity switch is exemplarily given in FIG. 7. The conventional oscillation circuit includes a LC resonance circuit which is formed by connecting a capacitor C in parallel to a detection coil L which is provided in the front part of the proximity switch. The LC resonance circuit receives an electric current from a constant current source 2 through a power source 3 and an end thereof which is connected to a transistor 4 for current amplification. The emitter of transistor 4 is grounded through a variable resistor 5 which determines the collector current, and a current mirror circuit CM1 consisting of a pair of transistor 6 and 7 is connected to the collector of transistor 4. The current produced from the LC resonance circuit is amplified by the transistor 4 and a current of the same amplitude as the amplified current is fed back by the current mirror circuit CM1 to the LC resonance circuit through the transistor 7. On account of this positive current feedback, the LC resonance circuit starts an oscillation at its resonance frequency. The speed of termination of the oscillation is varied by adjusting the shape and winding of the detection coil L or changing other circuit constants. As an object approaches the detection coil L and increases the conductance of the detection coil L, the oscillation is terminated soon or later. Accordingly, the response speed of a proximity switch may be considered as the total time of the start and the termination of oscillation. Generally, oscillation of an oscillation circuit is extremely slow in rise (start) speed but is relatively fast in termination speed. The time "T" required for oscillation to start, grow and reach a level which enables the detection of an object may be given as follows:

$$\tau = \frac{2c}{\Delta g} \times \ln \frac{V_o}{V_s} \quad (1)$$

where
- Vo: Output reversion level
- Vs: Amplitude level at the beginning of oscillation
- C: Capacitance of the resonance capacitor
- Δg: Variation of conductance from the beginning of oscillation.

Generally, the amplitude level at the termination of oscillation is a noise level which is, for instance, in the order of mV. As the detection distance is increased, the conductance variation decreases and the response speed decreases, causing the problem that the detection of a fast moving object becomes impossible. Furthermore, in an environment where a strong AC magnetic current is present as in a resistance welder which involves an electric current of more than ten thousand ampere, the ferrite core of the detection coil is saturated and, due to the increase in the loss in the detection coil, the oscillation is interrupted. Therefore, in such an environment, the conventional proximity switch of high frequency oscillation type may become unusable.

In view of such problems of conventional proximity switches, a primary object of this invention is to provide a proximity switch which has a high response speed through speed up in the start of oscillation.

A further object of this invention is to provide a proximity switch which is capable of withstanding a strong magnetic field so that it may be used in an environment where a strong AC magnetic field is present, such as in a resistance welder.

According to this invention, such objects are accomplished by providing a proximity switch of high frequency oscillation type having a current feedback type oscillation circuit in which a part of an oscillation current is fed back, and a detector circuit which detects an object by reduction in an oscillation output, characterized in that: the current feedback type oscillation circuit includes a first current mirror circuit for receiving the oscillation current for feeding back a part of a mirror current; a second current mirror circuit for receiving a part of the mirror current in the first current mirror circuit; a current feedback circuit for feeding back an output current from the second current mirror circuit together with the feedback current in the first current mirror circuit; a switching member for actuating the second current mirror circuit; and comparison means for comparing the oscillation output from the oscillation circuit with a predetermined level so as to actuate the switching member when the oscillation output has declined below the predetermined level; whereby when the oscillation output has declined, the feedback current is increased for maintaining the oscillation by the current feedback type oscillation circuit.

For a more complete understanding of this invention and for an appreciation of other objects and advantages thereof, attention is directed to the following description and the accompanying drawings in which:

DETAILED DESCRIPTION

Figure 1:
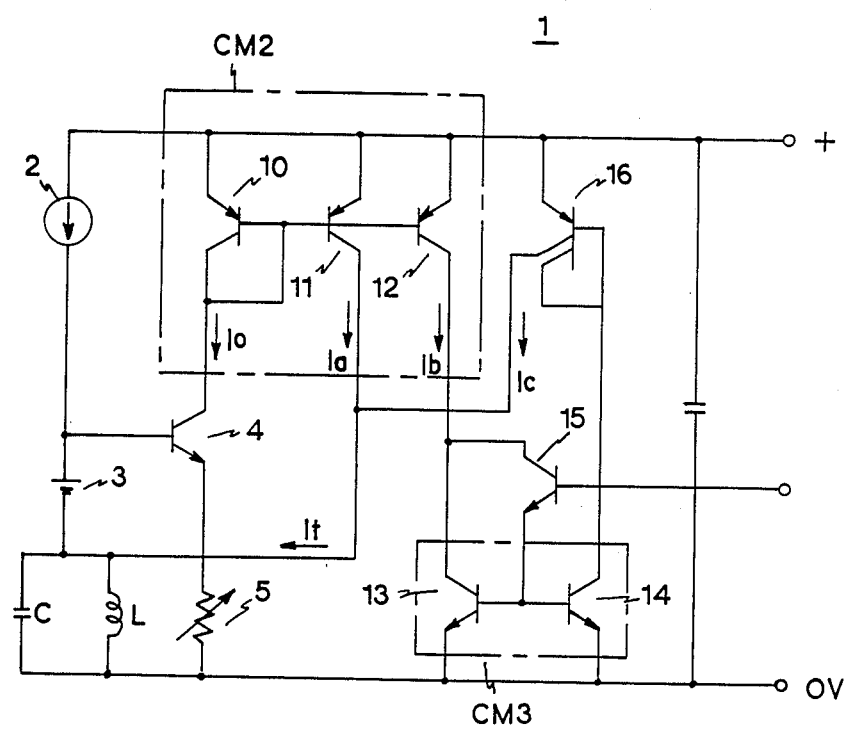
FIG. 1 is a circuit diagram of the first embodiment of an oscillation circuit for a proximity switch according to this invention.
Figure 7:
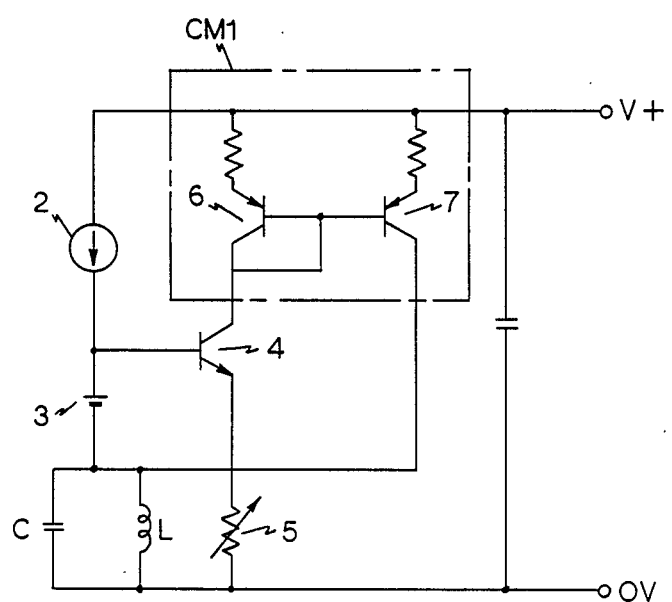
FIG. 7 is a circuit diagram showing a conventional oscillation circuit.

Referring to FIG. 1, there is shown a circuit diagram of an oscillation circuit for a proximity switch as the first embodiment of this invention. In the description of this embodiment, the parts corresponding to those in the conventional oscillation circuit illustrated in FIG. 7 are denoted with like reference numerals.

The oscillation circuit of this embodiment is so designed that oscillation continues with minute amplitudes even when an object has approached to be detected and the output of the oscillation has decreased. As a result, the collector of transistor 4 is connected to transistor 10 which forms a current mirror circuit CM2 in cooperation with other transistors 11 and 12. The respective transistors 10, 11 and 12 have their emitter areas n1S, n2S and n3S when an integrated-circuit chip is produced for the oscillation circuit. The transistor 11 applies a feedback current to the LC resonance circuit like the transistor 7 of the conventional circuit as illustrated in FIG. 7, and the collector of transistor 12 is connected to the collector of NPN transistor 13. The transistor 13 forms a current mirror circuit CM3 in cooperation with a transistor 14, and its collector and base are connected each other through a switching transistor 15 which becomes conductive to actuate the current mirror circuit CM3 in response to a signal applied thereto when the output of the oscillation circuit has decreased. The collector of transistor 14 of the current mirror circuit CM3 is connected to the base-and-collector common terminal of a multi-collector transistor 16 whose other collector is connected to the LC resonance circuit.

Figure 2:
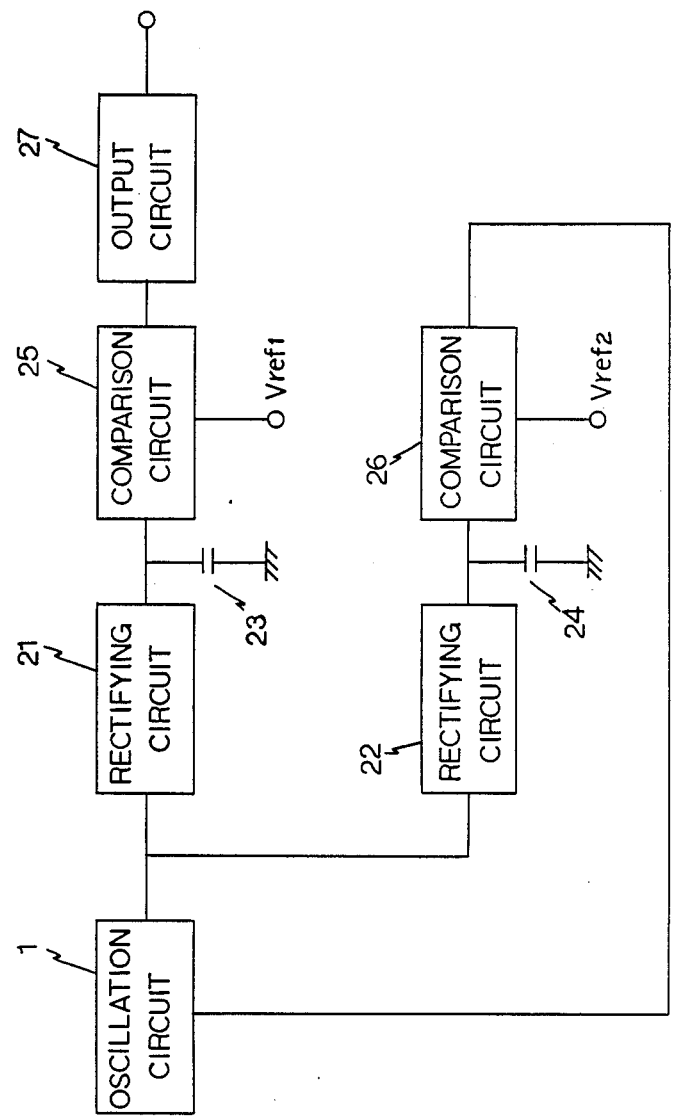
FIG. 2 is a block diagram showing the overall structure of the proximity switch according to this invention.

FIG. 2 is a block diagram showing the overall structure of a proximity switch employing the oscillation circuit of FIG. 1. The oscillation output of the oscillation circuit 1 shown in FIG. 1 is given to a pair of rectifying circuits 21 and 22. The rectifying circuits 21 and 22 convert the oscillation output into DC signals according to their time constants and their output ends are connected to capacitors 23 and 24 for smoothing having different capacitances and then to comparison circuits 25 and 26. The comparison circuits 25 and 26 are given with reference voltages Vref1 and Vref2 (Vref1>Vref2), respectively, which determine different threshold levels and convert the input signals into square wave signals. When the input signal decreases below the reference voltage Vref1, the comparison circuit 25 produces an output and transmits the output to outside through an output circuit 27 as an object detection signal. Meanwhile, the comparison circuit 26, which is given with the reference voltage Vref2 which is lower than that of the other comparison circuit 25 and converts the input signal into a square wave signal, transmits a signal to the transistor 15 of the oscillation circuit 1 of FIG. 1 when the level of its input signal is low.

Figure 3:
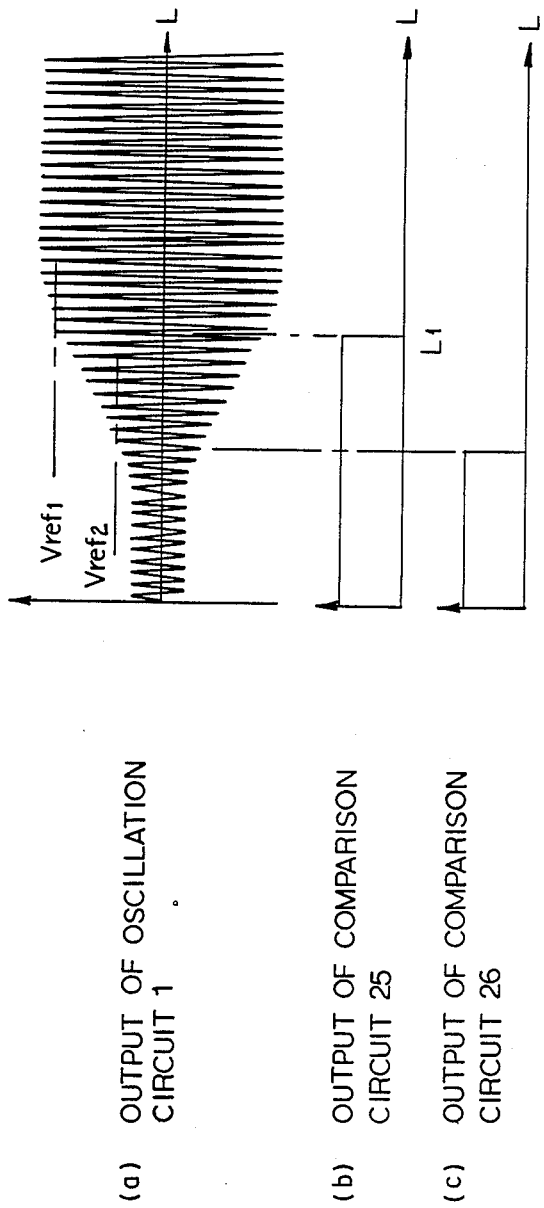
FIG. 3 is a wave form diagram for various points of the proximity switch in relation with the distance between the proximity switch and an object to be detected thereby according to the first embodiment.

FIG. 3 shows a diagram showing the wave forms of various parts in association with the distance between an approaching body and the detection coil (L) of this embodiment. When the object is sufficiently far away, the coil L is without any substantial loss. In the oscillation circuit 1, the voltage of the LC resonance circuit is given to the transistor 4 for current amplification and a collector current flows through the transistors 10 and 4. Due to this collector current, a feedback current is produced by the current mirror circuit having the transistor 10 and 11 to oscillate the circuit 1.

Now, suppose that the collector current of the transistor 10 is denoted as Io, the emitter currents of the transistors 11 and 12 as Ia and Ib. At this moment, since the object is far away and the oscillation level is high as shown in FIG. 3, the transistor 15, receiving no signal from the comparison circuit 26, is turned off. Therefore, the current mirror circuit CM3 is deactivated and there is no current feedback through the transistor 16 to the LC resonance circuit. As a result, the value of the current fed back to the LC resonance circuit is solely the collector current Ia of the transistor 11, and expressed by n2/n1·Io corresponding to the emitter area ratio of transistors 10 and 11.

As the object approaches the proximity switch, the oscillation output appearing across the resistor 5 of the oscillation circuit 1 declines rapidly as shown in FIG. 3(a). When the distance is L1, viz. when the output of the rectifying circuit 21 decreases to the reference voltage level Vref1 of the comparison circuit 25, an object detection signal is produced from the output circuit 27. When the object comes even closer to the proximity switch and the oscillation output decreases below the reference voltage level Vref2 of the comparison circuit 26, an output from the comparison circuit 26 is produced for application to the switching transistor 15 of the oscillating circuit 1 and transistor 15 is turned on. Then, the current mirror circuit CM3 formed by the transistors 13 and 14 turns into an active state and, by the collector current Ib of the transistor 12 flowing into the current mirror circuit CM3, the transistor 14 starts driving the multi-collector transistor 16. Thus, the other collector current Ic of the multi-collector transistor 16 is fed back to the LC resonance circuit. If the emitter areas of the transistors 13 and 14 are equal to each other, the collector current Ic of the transistor 16 is substantially equal to Ib and the value of electric current If fowing into the LC reasonance circuit is the sum of the currents Ia and Ic of the collectors of the transistors 11 and 16 as may be expressed by the following Equation:

$$If = Ia + \frac{n2S + n3S}{n1S} \cdot Io \quad (2)$$

Therefore, the feedback current If is substantially increased and the gain of the oscillation circuit may be increased. Thus, as shown in FIG. 3, the oscillation may be maintained even if the object comes even closer to the proximity switch.

As indicated in the above-mentioned Equation (1), the oscillation start response time "T" is dependent on the amplitude in the initial stage, and the oscillation rise time may be drastically reduced if the initial amplitude level Vs is high. Thus, the oscillation rise time may be improved by maintaining the oscillation at a low level even after the object has come close to the proximity switch and the object detection signal has been produced, as shown in FIG. 3(a).

Therefore, the response speed of the proximity switch may be increased by decreasing the capacitance of the capacitor 23 provided at the output end of the rectifying circuit 21 or reducing the time constant of the smoothing circuit. This proximity switch may be used in an environment where a strong AC magnetic field is present as in the case of a resistance welder where electric current of great magnitude is used. In this case, the oscillation can start near the zero cross points of the AC magnetic field and the oscillation can be started up in a brisk manner. For instance, when a AC magnetic field of 60 Hz is present, a series of burst wave forms of double the frequency of the magnetic field or 120 Hz can be obtained from the oscillation circuit 1. Accordingly, by increasing the capacitance of the output capacitor 23 of the rectifying circuit 21 to increase the smoothing time constant, detecting the presence of the burst oscillations with the rectifying circuit having a large time constant and comparing the obtained signal with a certain threshold voltage in the comparison circuit 25, a proximity switch which can withstand magnetic field can be obtained.

The feedback current to the LC resonance circuit is varied with change of emitter areas in the current mirror circuit CM2 in this embodiment, but if desired may be varied with change of emitter areas of transistors 13 and 14 in the current mirror circuit CM3.

Figure 4:
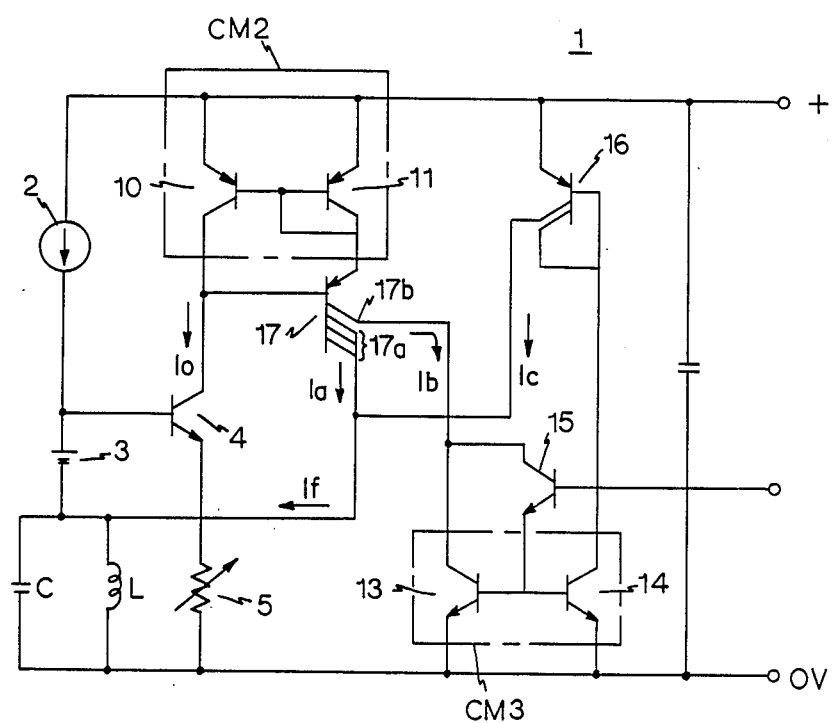
FIG. 4 is a circuit diagram of the second embodiment of the oscillation circuit.

Referring to FIG. 4, there is shown a circuit diagram of an oscillation circuit for the proximity switch as the second embodiment of this invention. The same parts as those of FIG. 1 are represented by the same reference numerals. The current mirror circuit CM2 of this embodiment consists of transistor 10 and transistor 11 whose collector is connected to a multi-collector transistor 17 having four collectors for dividing the mirror current. The transistor 17 has its base connected to the collector of transistor 10, its three collectors 17a commonly connected with the LC resonance circuit for feedback thereto, and its remaining collector 17b connected to the collector of transistor 13 in current mirror circuit CM3. Across base and collector of the transistor 13 is connected switching transistor 15 like in the above-mentioned embodiment.

When an object is sufficiently far away, the transistor 15 is turned off so that no current feedback be produced by transistor 16 through the current mirror circuit CM3, applying only a collector current Ia at the comon three collector terminal 17a to the LC resonance circuit as a feedback current. As the object approaches and the switching transistors 15 is turned on, the current Ib is applied to the current mirror circuit CM3 from the collector 17b of transistor 17 whereby the feedback current is increased by way of he transistor 16. Thus, even the approach of the object maintains the oscillation at low level as illustrated in the foregoing embodiment.

Figure 5:
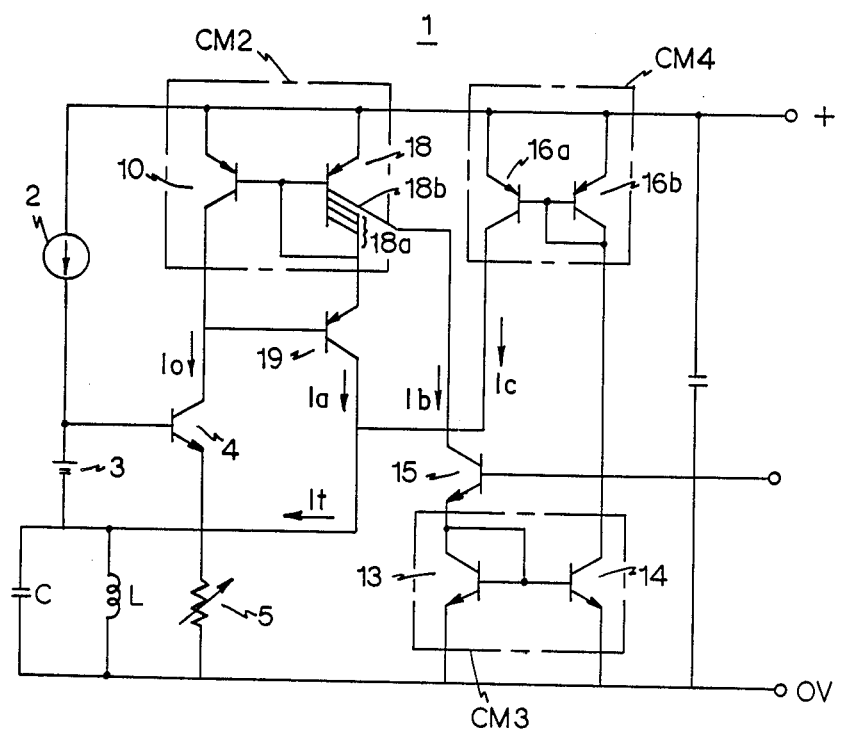
FIG. 5 is a circuit diagram of the third embodiment of the oscillation circuit.

In FIG. 5 there is shown a circuit diagram of an oscillation circuit for the proximity switch as the third embodiment of this invention. The same parts as those of the foregoing embodiments are represented by the same reference numerals. The foregoing transistor 11 of the current mirror circuit CM2 is replaced by a multi-collector transistor 18 having four collectors 18a and 18b for dividing the mirror current in this embodiment. The three collectors 18a of the transistor 18 are commonly connected with the common bases of the transistors 10 and 18, and with the emitter of the transistor 19. The base of transistor 19 is connected to the collector of transistor 10 which is connected with the LC resonance circuit for current feedback. The collector 18b of the transistor 18 may be directly connected to transistor 13 of the current mirror circuit CM3 like the foregoing embodiments, but, in this embodiment, is connected with the collector of the switching transistor 15 as shown in FIG. 5. The transistor 15 at its emitter is connected to the collector of transistor 13 of the current mirror circuit CM3 for switching a mirror current. The feedback current flowing to the LC resonance circuit may be the mirror current of the transistor 14 in the current mirror circuit CM3 fed back by the transistor 16 as described in the foregoing embodiments, but, as shown in FIG. 5, is produced by a current mirror circuit CM4 consisting of transistors 16a and 16b in this embodiment. The remaining construction is the same as that of the foregoing embodiments.

When an object is sufficiently far away, the switching transistor 15 of this embodiment is also turned off whereby no current feedback through the current mirror circuit CM3 is produced. Accordingly, the oscillation is maintained by applying current feedback to the LC resonance circuit from the three collectors 18a of the transistor 18 through transistor 19. As the object approaches, the switch is turned on whereby a collector current at other collector 18b of the transistor 18 is applied to the current mirror circuit CM3 through transistor 15. As a result, a mirror current through the current mirror circuit CM4 is fed back to the LC resonance circuit so as to maintain the oscillation at low level.

Figure 6:
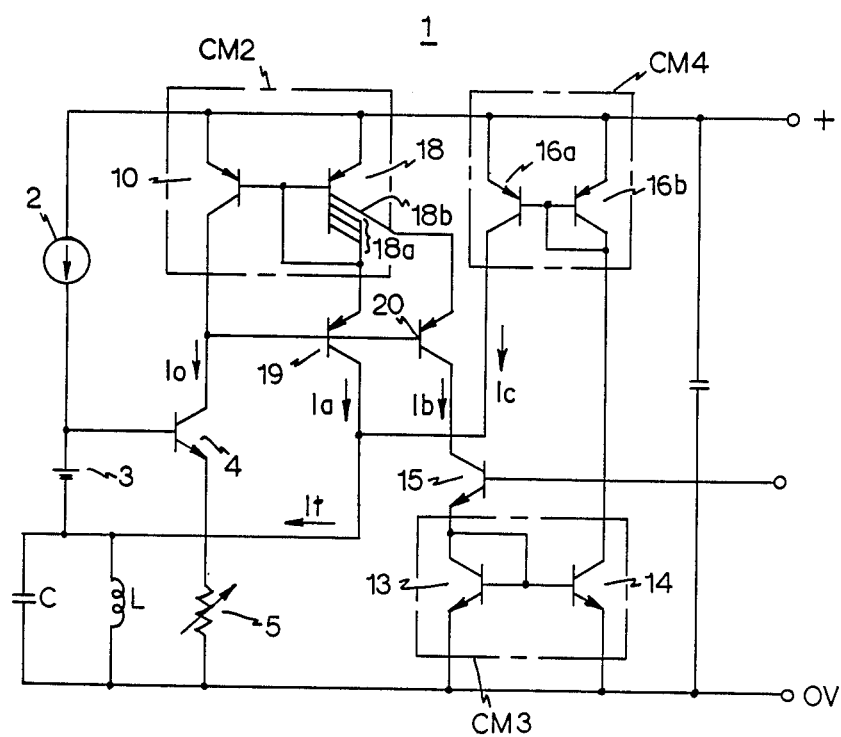
FIG. 6 is a circuit diagram of the fourth embodiment of the oscillation circuit.

FIG. 6 shows a circuit diagram of an oscillation cirucit for the proximity switch as the fourth embodiment of this invention. This embodiment is also represented by the same reference numerals as those of the foregoing embodiments with respect to the same parts. Like the circuit of FIG. 5, the current mirror circuit CM2 is formed by transistor 10 and multi-collector transistor 18 having one of collectors (18b) connected to a transistor 20 at its emitter. The bases of transistors 20 and 19 are commonly connected with the collector of transistor 10, and the collector of transistor 20 is connected to the collector of transistor 15. The transistor 15 at its emitter is connected to the collector of the transistor 13 constituting the current mirror circuit CM3. Other components in this embodiment are the same as those of the circuit of FIG. 5.

When an object is far away, the switching transistor 15 of this embodiment is also non-conductive and current feedback is applied to the LC resonance circuit through transistor 19 from transistor 18 at its collectors 18a. When the transistor 15 is turned on by the output from the comparator 26 of FIG. 2 employing this oscillation circuit, the mirror current derived from the collector 18b of the transistor 18 is applied to the current mirror circuit CM3 through transistors 20 and 15. Then, the feedback current to the LC resonance circuit through the current mirror circuit CM4 is increased so that the oscillation may be maintained at a low level as illustrated in FIG. 3.

Thus, according to foregoing embodiment, the comparison circuit is activated by decline of the oscillation output to drive the current mirror circuit. When the oscillation output has further declined after the proximity switch has detected an object, the current feedback is increased by the current mirror circuit and the oscillation may be maintained at a low level. Accordingly, the resumption of oscillation after the object has left is immediate and the response speed of the proximity switch may be increased. Moreover, because the response speed is fast, even in an environment where a strong AC magnetic field is present, the oscillation may be maintained near the zero cross point of the AC magnetic field in an intermittent manner. Therefore, by increasing the time constant of a smoothing circuit which produces an object detection signal, the proximity switch may become sufficiently resistant to magnetic field to be cable of detecting an object even in a very strong magnetic field.

Although the present invention has been shown and described with reference to the preferred embodiment thereof, and in terms of the illustrative drawings, it should not be considered as limited thereby. Various possible modifications and alterations could be conceived of by one skilled in the art to any particular embodiment, without departing from the scope of the invention. Therefore it is desired that the scope of the present invention should be defined not by any of the perhaps purely fortuitous details of the shown preferred embodiment, or of the drawings, but solely by the scope of the appended claims, which follow.

What is claimed is:

1. A high speed proximity switch of high frequency oscillation type, comprising:
   oscillation means for generating an oscillation output which is reduced with the approach of an object to be detected by the proximity switch;
   feedback means associated with the oscillation means for feeding back a part of an oscillation current within the oscillation means;
   comparator means for comparing the oscillation output with a predetermined level to generate an output signal when the oscillation output is below the predetermined level; and
   a switching means for receiving the output signal and for triggering the feedback means, and wherein the feedback means rapidly responds to the switching means adapted to increase feedback current directly within the oscillation means.

2. A high speed proximity switch according to claim 1 wherein the feedback means comprises a first current mirror circuit receiving the oscillation current with the oscillation means to feed back a first part of a mirror current within the first current mirror circuit, a second current mirror circuit receiving a second part of the mirror current within the first current mirror circuit, a switching circuit for the switching means for controlling the activation of the second current mirror circuit in response to the output signal from the comparator means, and a feedback circuit receiving a mirror current produced from the second current mirror circuit for feeding back the same in addition to the first part of the mirror current.

3. A high speed proximity switch according to claim 2 therefor feedback circuit is a third current mirror circuit for receiving the mirror current from the second current mirror circuit for generating a mirror current corresponding thereto for feedback.

4. A high speed proximity switch according to claim 2 wherein the feedback circuit is a multicollector transistor having its one collector connected with the second current mirror circuit and another collector with a resonance circuit of the oscillation means.

5. A high speed proximity switch according to claim 2 wherein the second current mirror circuit is activated when the output signal from the comparator means is applied to the switching circuit for turning on thereof.

6. A high speed proximity switch according to claim 1 wherein the oscillation means includes a LC resonance circuit and wherein the feedback means feeds back the part of the oscillation current to the LC resonance circuit.

7. A high speed proximity switch of high frequency oscillation type, comprising:
   oscillation means for generating an oscillation output which is reduced with the approach of an object to be detected by the proximity switch;
   feedback means associated with the oscillation means for feeding back a part of an oscillation current within the oscillation means; and
   comparator means for comparing the oscillation output with a predetermined level to generate an output signal when the oscillation output is below the predetermined level, wherein the feedback means rapidly responds to the output signal from the comparator means adapted to increase fed back current directly within the oscillation means, and wherein the feedback means comprises:
   (a) a first current mirror circuit for receiving the oscillation current with the oscillation means to feed back a first part of a mirror current within the first current mirror circuit, wherein the first current mirror circuit comprises first, second and third transistors.
   (b) A second current mirror circuit for receiving a second part of the mirror current within the first current mirror circuit, wherein the second transistor applies feed back current to the oscillation means while the third transistor applies the second part of the mirror current to the second current mirror circuit,
   (c) a switching circuit for controlling the activation of the second current mirror circuit in response to the output signal from the comparator means, and
   (d) a feedback circuit for receiving a mirror current produced from the second current mirror circuit for feeding back the same in addition to the first part of the mirror current.

8. A high speed proximity switch of high frequency oscillation type, comprising:
   oscillation means for generating an oscillation output which is reduced with the approach of an object to be detected by the proximity switch;
   feedback means associated with the oscillation means for feeding back a part of an oscillation current within the oscillation means; and
   comparator means for comparing the oscillation output with a predetermined level to generate an output signal when the oscillation output is below the predetermined level, wherein the feedback means rapidly responds to the output signal from the comparator means adapted to increase fed back current directly within the oscillation means, and wherein the feedback means comprises:
   (a) a first current mirror circuit for receiving the oscillation current with the oscillation means to feed back a first part of a mirror current within the first current mirror circuit,
   (b) a second current mirror circuit for receiving a second part of the mirror current within the first current mirror circuit,
   (c) a switching circuit for controlling the activation of the second current mirror circuit in response to the output signal from the comparator means, and
   (d) a feedback circuit of receiving a mirror current produced from the second current mirror circuit for feeding back the same in addition to the first part of the mirror current, wherein the feedback circuit is a third current mirror circuit for receiving the mirror current from the second current mirror circuit for generating a mirror current corresponding thereto for feedback.

* * * * *